(12) United States Patent
Chu et al.

(10) Patent No.: US 7,258,811 B2
(45) Date of Patent: Aug. 21, 2007

(54) WAFER STAGE INCLUDING ELECTROSTATIC CHUCK AND METHOD FOR DECHUCKING WAFER USING THE WAFER STAGE

(75) Inventors: Chang-woong Chu, Suwon (KR); Kyeong-koo Chi, Seoul (KR); Ji-soo Kim, Sungnam (KR); Seung-pil Chung, Seoul (KR); Sang-hun Seo, Daejeon (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 413 days.

(21) Appl. No.: 10/864,428

(22) Filed: Jun. 10, 2004

(65) Prior Publication Data

US 2004/0223286 A1 Nov. 11, 2004

Related U.S. Application Data

(62) Division of application No. 09/951,709, filed on Sep. 14, 2001, now Pat. No. 6,793,767.

(30) Foreign Application Priority Data

Nov. 9, 2000 (KR) ................................. 00-66434

(51) Int. Cl.
  *B44C 1/22* (2006.01)
(52) U.S. Cl. .................... 216/67; 438/714; 134/1.2; 427/533

(58) Field of Classification Search ............... 216/67; 438/714; 134/1.2; 427/533
See application file for complete search history.

(56) References Cited

U.S. PATENT DOCUMENTS

| 5,310,453 | A | * | 5/1994 | Fukasawa et al. ........... 438/716 |
| 5,382,311 | A | * | 1/1995 | Ishikawa et al. ....... 156/345.54 |
| 5,665,167 | A | | 9/1997 | Deguchi et al. |
| 5,900,062 | A | | 5/1999 | Lowenhardt et al. |
| 5,904,779 | A | | 5/1999 | Dhindsa et al. |
| 5,981,913 | A | | 11/1999 | Kadomura et al. |

FOREIGN PATENT DOCUMENTS

| JP | 4-253356 | 9/1992 |
| KR | 94-20497 | 9/1994 |

* cited by examiner

*Primary Examiner*—George A. Goudreau
(74) *Attorney, Agent, or Firm*—Lee & Morse, P.C.

(57) ABSTRACT

A wafer stage including an electrostatic chuck and a method for dechucking a wafer using the wafer stage are provided, wherein the wafer stage includes an electrostatic chuck support, an electrostatic chuck, a lifting means, and a grounding means including a device for connecting the interconnections for grounding the lifting means. According to the method for dechucking a wafer, when a lifting means is in contact with a rear side of the wafer, the lifting means is grounded. Then, an electrostatic chuck is neutralized by supplying power to electrostatic electrodes, and the wafer is neutralized by supplying plasma to the wafer.

3 Claims, 5 Drawing Sheets

WAFER STAGE INCLUDING ELECTROSTATIC CHUCK AND METHOD FOR DECHUCKING WAFER USING THE WAFER STAGE

CROSS REFERENCE TO RELATED APPLICATION(S)

This is a divisional application based on application Ser. No. 09/951,709, filed Sep. 14, 2001 now U.S. Pat. No. 6,793,767, the entire contents of which is hereby incorporated by reference.

BACKGROUND OF THE INVENTION

1. Field of the Invention

The present invention relates to an apparatus for manufacturing a semiconductor device and a method for using the apparatus. More particularly, the present invention relates to a wafer stage including an electrostatic chuck, and to a method for dechucking a wafer using the wafer stage.

2. Description of the Related Art

Semiconductor devices are manufactured after performing many processes such as depositing a material layer on a wafer, patterning the deposited material layer, and removing unnecessary residuals on the wafer. To perform these processes repeatedly, a wafer is loaded on a wafer stage inside a chamber, the wafer is processed, and then unloaded.

In order to successively process a wafer, it is very important to chuck and fix the wafer in the chamber and to dechuck the wafer so that the wafer will not be damaged after processing. As semiconductor devices become highly integrated, the design rule becomes smaller, and the process margin becomes narrower. As a result, there is a greater need to chuck and fix the wafer without damaging the wafer during dechucking.

Methods for fixing the wafer to the wafer stage in the process chamber when the wafer is loaded on the wafer stage include using hardware structures such as clamps, using a vacuum to suction the rear side of the wafer (a vacuum chuck), using gravity, and using a piezoelectric effect. Various methods are available for dechucking the fixed wafer on the wafer stage after processing the wafer. The dechucking method used is chosen in accordance with the method used for fixing the wafer.

The most widely used method for fixing a wafer is the piezoelectric effect. In this method, an electrostatic chuck is used to fix the wafer, and the electrostatic chuck and a lifting means are used to dechuck the fixed wafer.

FIG. 1A illustrates a sectional view of a method for chucking a wafer using an electrostatic chuck according to the prior art. Referring to FIG. 1A, first, the structure of an electrostatic chuck 10 will be described, and then, a method for chucking a wafer 20 will be described. The electrostatic chuck 10 includes an upper insulating layer 2, an electrostatic electrode 4, a lower insulating layer 6, and a lower electrode 8. The lower electrode 8 controls the reaction speed of plasma when plasma is generated in the chamber (not shown). The electrostatic electrode 4 is connected to a DC generator (not shown), and positive charges or negative charges are distributed on the electrostatic electrode 4 by the DC generator. The electric charges on the electrostatic electrode 4 induce an electrostatic field such that the wafer 20 is chucked or dechucked. The electrostatic electrode 4 and the lower electrode 8 are insulated by the lower insulating layer 6, and the wafer 20 and the electrostatic electrode 4 are insulated by the upper insulating layer 2.

In a method for dechucking the wafer 20 according to the prior art, the wafer 20 is put on the electrostatic chuck 10, and an electrostatic field is induced by supplying power to the electrostatic electrode 4 under the upper insulating layer 2 on the upper surface of the electrostatic chuck 10. Positive charges accumulate on the electrostatic electrode 4 connected to the external DC generator (not shown), and negative charges accumulate on the lower surface of the wafer 20 by plasma generated on an upper portion of the wafer 20, thereby inducing an electrostatic field between the wafer 20 and the electrostatic electrode 4. When the upper surface of the electrostatic chuck 10 is completely in contact with the wafer 20, a clamping force is produced by the electrostatic field, and thus, the wafer 20 is chucked.

Meanwhile, some of the charges on the electrostatic electrode 4 of the electrostatic chuck 10 flow into the upper surface of the electrostatic chuck 10 through the upper insulating layer 2, and as time goes by, the electric charges accumulate. The clamping force between the wafer 20 and the electrostatic chuck 10 increases due to the accumulated electric charges. As a result, the magnitude of the clamping force grows larger than the voltage applied to the electrostatic electrode 4 of the electrostatic chuck 10. The wafer 20 and the electrostatic chuck 10 are stuck together by the increased clamping force when the wafer 20 and the electrostatic chuck 10 are dechucked.

FIG. 1B illustrates a sectional view of a method for dechucking a wafer 20 using an electrostatic chuck according to the prior art. When the wafer 20 is chucked, plasma formation on the upper portion of the wafer 20 stops, and the voltage supplied to the lower electrode 8 and the electrostatic electrode 4 of the electrostatic chuck 10 is turned off. As a result, the electric charges flow out and the clamping force is reduced. However, since a discharge time is necessary for the charges to flow when the clamping force is reduced, the wafer 20 becomes stuck to the electrostatic chuck 10.

When lift pins 12 are raised to dechuck a wafer 20 that is stuck to the electrostatic chuck 10, the force applied to the wafer 20 can easily damage the wafer 20. In order to prevent the sticking phenomenon, power is again supplied to the electrostatic electrode 4, in which positive charges remain, and negative charges flow into the electrostatic electrode 4. That is, electric charges having a charge opposite to those supplied to the electrostatic electrode 4 during chucking flow into the electrostatic electrode 4 during dechucking in order to neutralize the electrostatic electrode 4, thereby easily dechuck the wafer 20.

Subsequently, the lift pins 12 of the lifting means (not shown) are raised, and the wafer 20 is dechucked. However, in the method for supplying electric charges having an opposite polarity to the electrostatic electrode 4, the wafer 20 still possesses electric charges, and thus, the method is not of much help for dechucking.

SUMMARY OF THE INVENTION

In order to solve the aforementioned problems, it is a feature of an embodiment of the present invention to provide a wafer stage which is capable of easy dechucking and includes an electrostatic chuck which does not damage a wafer.

Another feature of an embodiment of the present invention is to provide a method for dechucking a wafer using the wafer stage.

In an effort to satisfy these and other features of the present invention, there is provided a wafer stage installed in a process chamber including: an electrostatic chuck support installed in a lower half of an enclosed chamber for supporting an electrostatic chuck; an electrostatic chuck installed on the electrostatic chuck support for chucking and supporting a wafer; a lifting means installed inside the electrostatic chuck and the electrostatic chuck support for lifting the wafer; and a grounding means including interconnections for connecting the lifting means to ground and a device for connecting the interconnections, which is installed between the interconnections, for allowing electric current flow and preventing electric current flow.

Preferably, the wafer stage further includes a guide ring installed around the electrostatic chuck for guiding the wafer when the wafer is chucked.

Preferably, the process chamber is a device for processing the wafer using plasma or a device for etching plasma.

Preferably, the lifting means includes: a plurality of lift pins for passing the electrostatic chuck and lifting the wafer; a lift pin support for supporting the lift pins in the electrostatic chuck support; a connecting axis for connecting the lift pin support to a driving means; and a driving means for lifting the connecting axis. Also, it is preferable that the lift pins are formed of a conductive material and that the conductive material is aluminum.

Preferably, the electrostatic chuck includes: a lower electrode, which is connected to a DC generator located outside the enclosed chamber, for controlling the reaction speed of plasma; an insulating flat plate on an upper portion of the lower electrode; and an electrostatic electrode, which is connected to a RF generator outside the chamber, for generating static electricity. The electrostatic electrode may have a spiral form. The electrostatic chuck may further include a wafer cooler under the lower electrode in which cool water is circulated. The electrostatic electrode may include a plurality of electrostatic electrodes.

Preferably, the process chamber is a device for processing the wafer using plasma; more particularly, a device for etching plasma.

According to another embodiment of the present invention, there is provided a method for dechucking a wafer including: (a) processing a wafer formed on an electrostatic chuck of an enclosed chamber using plasma; (b) stopping plasma formation and turning off the voltage supplied to an electrostatic electrode and a lower electrode of the electrostatic chuck; (c) contacting a lifting means with a rear side of the wafer; (d) grounding the wafer; (e) neutralizing the electrostatic chuck by supplying power to the electrostatic electrode and neutralizing the wafer by supplying plasma to the wafer; and (f) dechucking the wafer by raising the lifting means. The electrostatic electrode may include a plurality of electrostatic electrodes.

Preferably, the processing in (a) is an etching process, and in (d), a device for connecting the interconnections of a grounding means connected to the lifting means is turned on.

Preferably, the plasma used in the chamber is generated on an upper electrode.

The present invention may prevent sparks between the wafer and the lifting means, and may cause the sticking phenomenon of the wafer to the electrostatic chuck to be overcome, thereby allowing easy dechucking of the wafer.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF A PREFERRED EMBODIMENT

Korean Patent Application No. 2000-66434, filed on Nov. 9, 2000, and entitled: "Wafer Stage Including Electrostatic Chuck and Method for Dechucking Wafer Using the Wafer Stage," is incorporated by reference herein in its entirety.

A wafer stage including an electrostatic chuck and a method for dechucking a wafer using the wafer stage may be used for a deposition process, an ashing process, and an etching process using plasma. Hereinafter, for convenience of explanation, a preferred embodiment of the present invention and a sample example will be described with reference to an etching process using plasma.

Figure 1A:
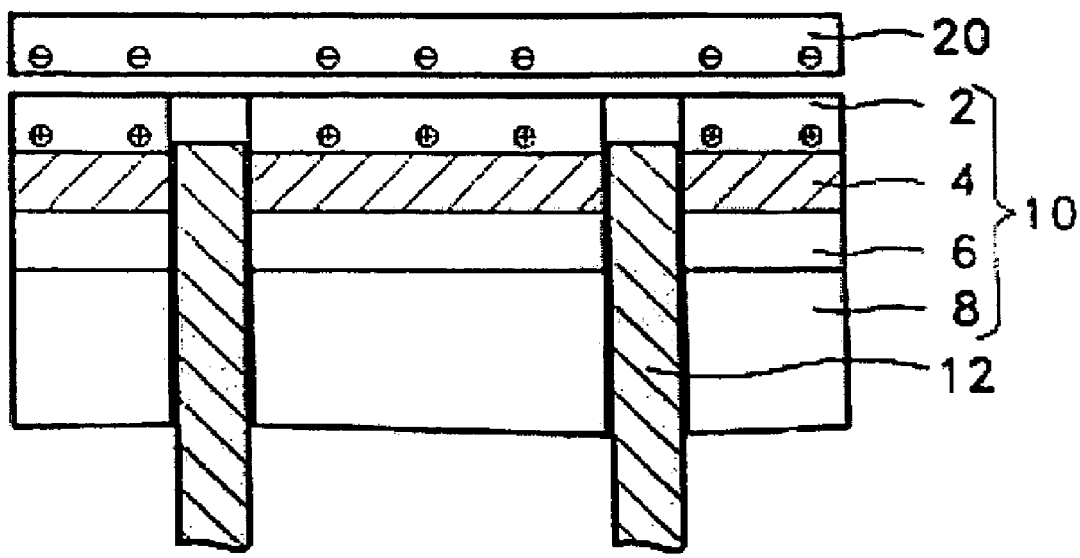
FIGS. 1A and 1B illustrate sectional views of methods for chucking and dechucking an electrostatic chuck according to the prior art.
Figure 1B:
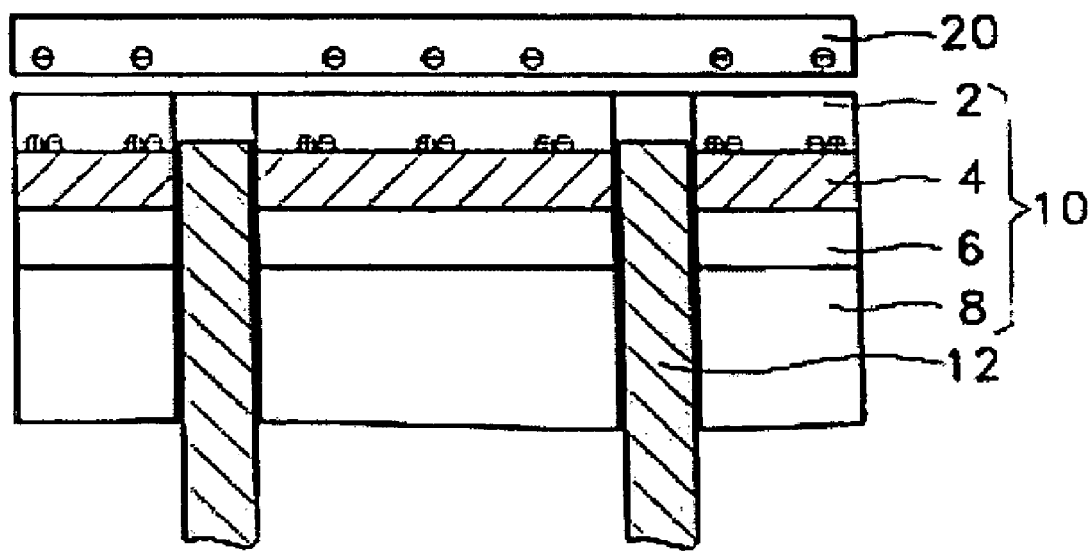
Figure 2:
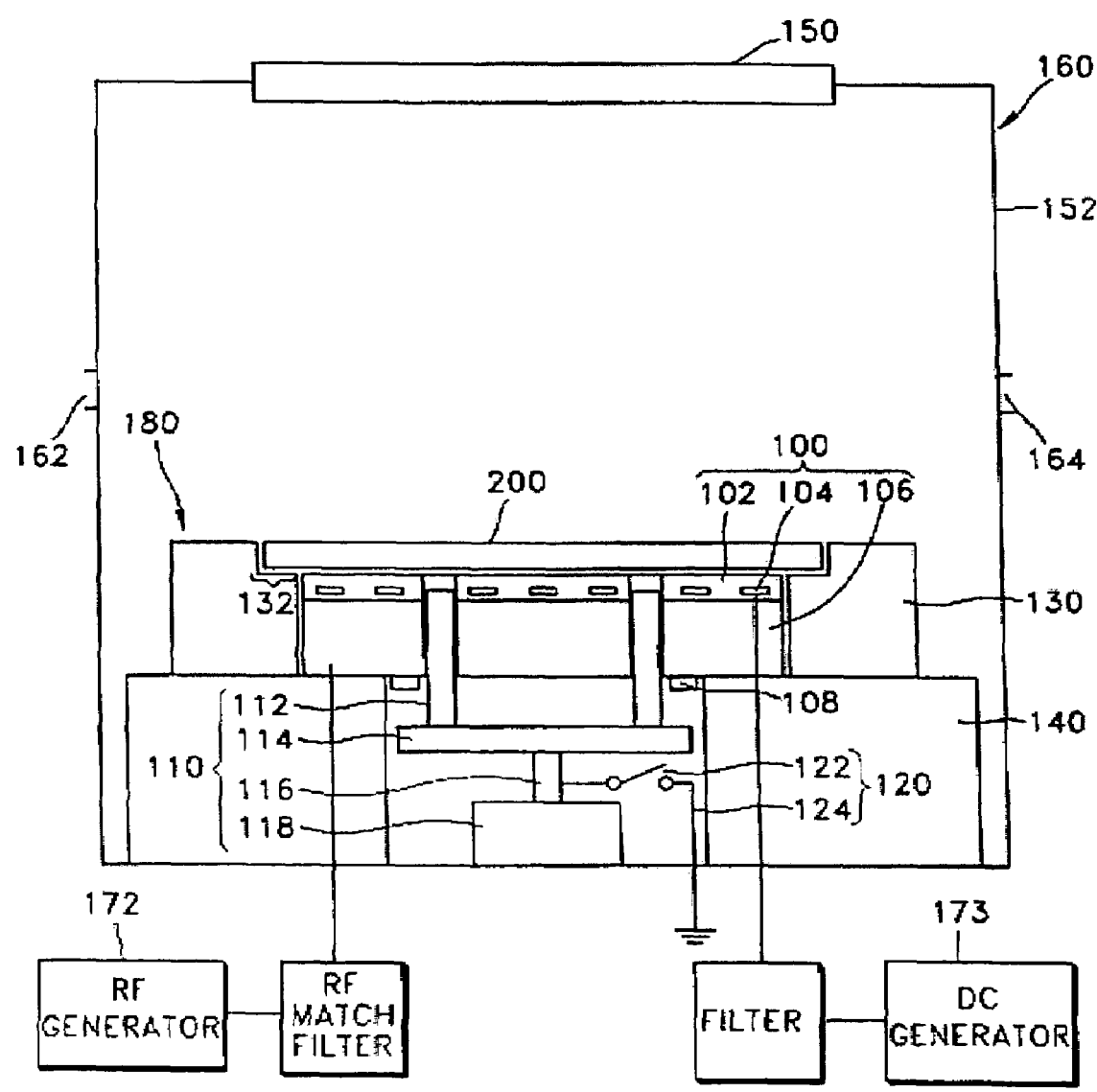
FIG. 2 illustrates a schematic of a wafer stage including an electrostatic chuck according to a preferred embodiment of the present invention.

FIG. 2 illustrates a sectional view of a wafer stage including an electrostatic chuck according to a preferred embodiment of the present invention. Referring to FIG. 2, a process chamber 160 includes an enclosed chamber 152 having an upper electrode 150 on an upper wall of the enclosed chamber 152, and a wafer stage 180 in the lower half of the enclosed chamber 152. A gas inlet 162 and a gas outlet 164 are located on the sidewalls of the enclosed chamber 152. A reactive gas necessary during wafer processing and a plasma source gas are injected into the enclosed chamber 152 via the gas inlet 162, and waste gas is exhausted through the gas outlet 164 after processing a wafer 200. The upper electrode 150 is connected to an external radio frequency (RF) generator (not shown), and power is applied to the upper electrode 150 by the RF generator. When power is applied to the upper electrode 150, the plasma source gas injected through the gas inlet 162 reacts to form plasma in the enclosed chamber 152. Argon (Ar) and $C_4F_8$ may be used as the plasma source gas. The process chamber 160 is preferably a device for processing a wafer using plasma, more particularly, a device for etching plasma.

The wafer stage 180 includes an electrostatic chuck support 140 on the bottom of the process chamber 160, an electrostatic chuck 100 on the electrostatic chuck support 140, a lifting means 110 within the electrostatic chuck 100 and the electrostatic chuck support 140, and a grounding means 120 for electrically grounding the lifting means 110.

The electrostatic chuck support 140 supports the electrostatic chuck 100 and a guide ring 130 and has a space where the lifting means 110 can be installed.

The electrostatic chuck 100 includes: a lower electrode 106, which is installed on top of the electrostatic chuck support 140 and is connected to a RF generator 172 located outside the enclosed chamber 152; an insulating flat plate 102 on an upper portion of the lower electrode 106; and a plurality of electrostatic electrodes 104, which are connected to a DC generator 173 located outside the enclosed chamber 152, for generating static electricity. Also, a plurality of holes inside the electrostatic chuck 100 enable lift pins 112 of the lifting means 110 to be raised or lowered. The electrostatic chuck 100 can chuck the loaded wafer 200 and dechuck the wafer 200 easily after processing.

Preferably, the plurality of electrostatic electrodes 104 in the insulating flat plate 102 have a spiral form, and one end thereof is connected to the DC generator 173 so that positive or negative charges can accumulate on the plurality of electrostatic electrodes 104 when power is supplied thereto. The positive or negative charges on the plurality of electrostatic electrodes 104 induce an electrostatic field to chuck or dechuck the wafer 200. That is, when the wafer 200 is chucked, the DC generator 173 supplies power to the plurality of electrostatic electrodes 104 such that electric charges having a charge opposite to those in the wafer 200 flow into the electrostatic electrodes 104. When the wafer 200 is dechucked, electric charges having a charge opposite to those remaining in the plurality of electrostatic electrodes 104 flow into the electrostatic electrodes 104. Preferably, materials such as aluminum (Al) and copper (Cu) are used for the electrostatic electrodes 104. The electrostatic electrodes 104 have a spiral form in the preferred embodiment. However, various forms of electrostatic electrodes 104 may be made. Also, one electrostatic electrode may be used. The power supplied from the DC generator 173 is filtered to pass a predetermined voltage. A direct current (DC) voltage, which is necessary when the wafer 200 is chucked or dechucked, is applied to the plurality of electrostatic electrodes 104. The details will be described later in a method for dechucking the wafer.

The insulating flat plate 102 is a circular, flat plate formed of an insulating material. Within the insulating flat plate 102 are electrostatic electrodes 104 having, preferably, a spiral form and a plurality of holes that enable lift pins 112 of the lifting means 110 to be passed through. The insulating flat plate 102 prevents contact between the wafer 200, the electrostatic electrodes 104, and the lower electrode 106.

The lower electrode 106 accelerates or reduces plasma formation in the enclosed chamber 152. That is, the plasma formed by the upper electrode 150 on the upper wall of the enclosed chamber 152 is accelerated by the lower electrode 106 and moved into the wafer 200. The acceleration can be controlled by the voltage across the lower electrode 106. An alternating current (AC) generated by a RF generator 172 located outside the enclosed chamber 152 is filtered by a RF match filter to allow a predetermined voltage and current to reach the lower electrode 106. Preferably, aluminum (Al) is used for the lower electrode 106.

The lifting means 110 includes a plurality of lift pins 112 which move up and down the holes for passing the electrostatic chuck 100, a lift pin support 114 for supporting the lift pins 112 in the electrostatic chuck support 140, a connecting axis 116 for connecting the lift pin support 114 to a driving means 118, and a driving means 118 for lifting the connecting axis 116.

The lift pins 112 are formed such that the wafer 200 can be easily lifted and stress is not concentrated on one spot of the wafer 200 when the wafer 200 is dechucked. Preferably, the lift pins 112 are formed of a conductive material such as aluminum (Al), so that electric charge on the wafer 200 can be easily grounded when the lift pins 112 are in contact with the wafer 200.

The lift pin support 114 supports the lift pins 112 and has a circular form. The lift pin support 114 and the connecting axis 116 may be formed of aluminum (Al).

A power source for lifting the wafer 200 is necessary to dechuck the wafer 200. The driving means 118 is the device for lifting the wafer 200. A spring, a hydraulic motor, or a pneumatic motor may be used for the driving means 118.

Various changes to the design of the lifting means 110 may be made. However, even though the lifting means 110 may be designed differently, a part of the lifting means 110 must still be connected to a grounding means 120, and a conductive material must be used for the lifting means. Aluminum (Al) is preferably used as the conductive material.

The grounding means 120 includes interconnections 124 for connecting the lifting means 110 to ground and a device for connecting the interconnections 122 for allowing or preventing electric current flow. The interconnections 124 of the grounding means 120 may be connected to part of the lifting means 110, for example, the lift pins 112, the lift pin support 114, or the connecting axis 116. The device for connecting the interconnections 122 of the grounding means 120 is turned off when the wafer 200 is chucked. When the wafer 200 is dechucked, the device for connecting the interconnections 122 of the grounding means 120 is turned on, thereby grounding a lower portion of the wafer 200. An on-off switch is preferably used for the device for connecting the interconnections 122. The details will be described later with reference to the following method for dechucking the wafer.

The wafer stage 180 further includes a guide ring 130 installed around the electrostatic chuck 100 for aligning the wafer 200. Preferably, the height of a portion 132 of the guide ring 130, on which the wafer is seated, is the same as the height of the surface of the electrostatic chuck 100.

Also, the wafer stage 180 may further include a wafer cooler 108 under the lower electrode 106 of the electrostatic chuck 100. Preferably, cool water is used as a cooling agent circulated in the wafer cooler 108. The wafer cooler 108 is necessary to cool the wafer 200 before the wafer 200 is unloaded after processing. Thereby, heating of the wafer 200 can be reduced and deformation of the wafer 200 during unloading can be prevented. Also, a separate cooling chamber (not shown) may not be necessary after processing the wafer 200 and throughput may be increased.

FIGS. 3A through 3E illustrate sectional views of a method for dechucking a wafer according to a preferred embodiment of the present invention.

Figure 3A:
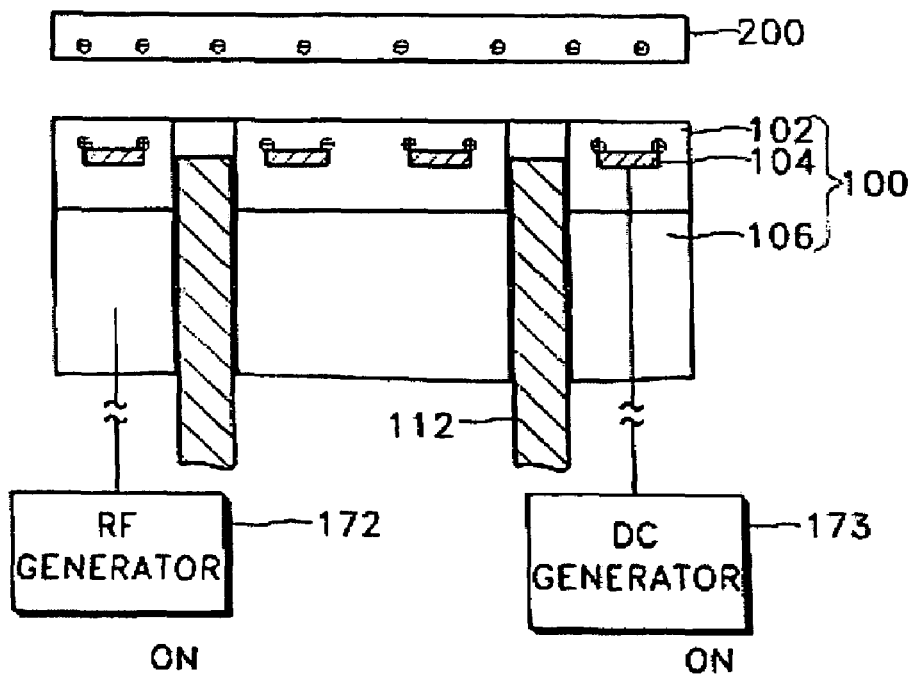
FIGS. 3A through 3E illustrate sectional views of a method for dechucking a wafer according to a preferred embodiment of the present invention.

FIG. 3A illustrates distribution of electric charges on the rear side of the wafer 200 and upper surface of the electrostatic chuck 100 when the wafer 200 is chucked on the electrostatic chuck 100. The wafer 200 is put on the electrostatic chuck 100 and plasma is generated by applying power to the upper electrode 150 (of FIG. 2) on the upper wall of the enclosed chamber 152 (of FIG. 2). A high voltage from the DC generator 173 is applied to the electrostatic electrodes 104 of the electrostatic chuck 100, and positive charges accumulate on an upper portion of the electrostatic chuck 100. The RF generator 172 is turned on, and negative charges generated by the plasma flow into the wafer 200. Thus, an electric field is induced between the wafer 200 and the electrostatic electrodes 104, causing the wafer 200 and the electrostatic chuck 100 to be stuck to each other. In a preferred embodiment, argon (Ar) is used as a plasma source gas and therefore positive charges accumulate on the electrostatic electrodes 104. However, the kind of electric charge that accumulates on the electrostatic electrodes 104 depends upon the plasma source gas used.

The upper surface of the electrostatic chuck 100 is in complete contact with the wafer 200 because of the clamping force produced by the electric field, and therefore, the wafer 200 is chucked. Assuming that the wafer 200 and the electrostatic electrodes 104 are electrodes of a capacitor, the clamping force can be expressed by Equation 1.

$$F = \tfrac{1}{2} A e_o e_r (V/t)^2 \quad \text{[Equation 1]}$$

F: Clamping force
A: Area of a wafer
$e_o$: Dielectric constant of free space
$e_r$: Dielectric constant of a specific layer
V: Voltage
t: Thickness of insulating layer Referring to Equation 1, clamping force is proportional to the area of a wafer, dielectric constants, and a voltage squared, and inversely proportional to the thickness squared of the insulating layer. That is, the larger the difference in voltage applied to the wafer 200 and the electrostatic electrodes 104 and the thinner the insulating flat plate 102, the greater the clamping force.

Some of the charges accumulated on the electrostatic electrodes 104 flow into the upper surface of the electrostatic chuck 100 through the insulating flat plate 102, and as time goes by, electric charges accumulate on the upper surface of the electrostatic chuck 100. Also, electric charges accumulate on the lower surface of the wafer 200 in proportion to the amount of electric charges accumulated on the upper surface of the electrostatic chuck 100. The accumulated electric charges increase the clamping force between the wafer and the electrostatic chuck 100. The accumulated electric charges do not flow out when the wafer 200 is dechucked.

Figure 3B:
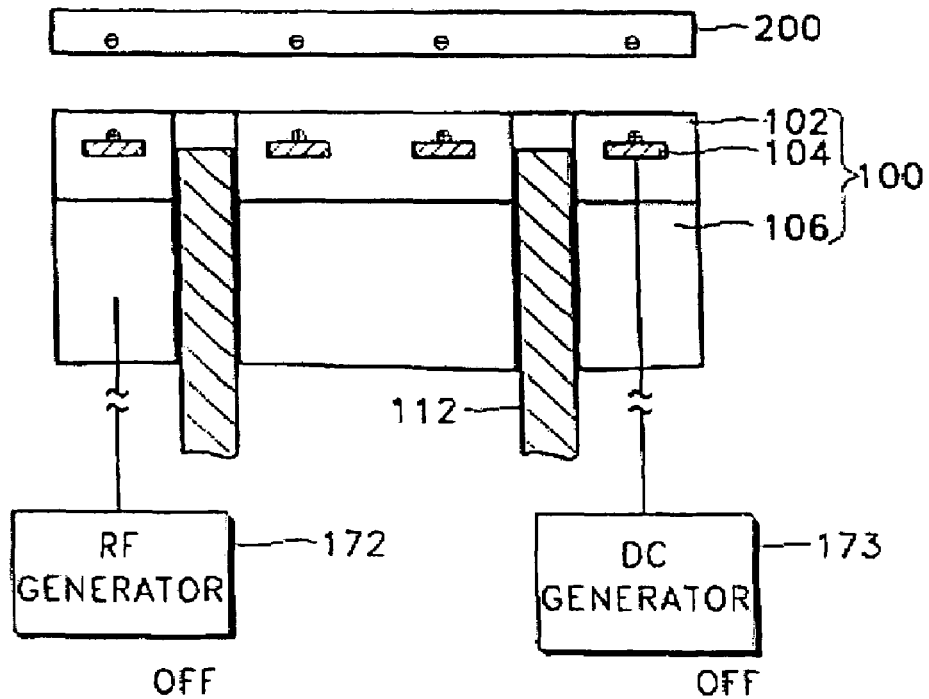

FIG. 3B illustrates a sectional view of a first step of dechucking the wafer 200 after processing the wafer 200, in which plasma formation stops, and power supply to the electrostatic electrodes 104 and the lower electrode 106 is turned off. Specifically, in order to dechuck the wafer 200 after plasma reaction, power supply to the upper electrode 150 (of FIG. 2) is turned off and a plasma source gas is no longer injected into the enclosed chamber 152 (of FIG. 2), and consequently plasma formation stops. Subsequently, power supply to the lower electrode 106 and the electrostatic electrodes 104 of the electrostatic chuck 100 is turned off.

Figure 3C:
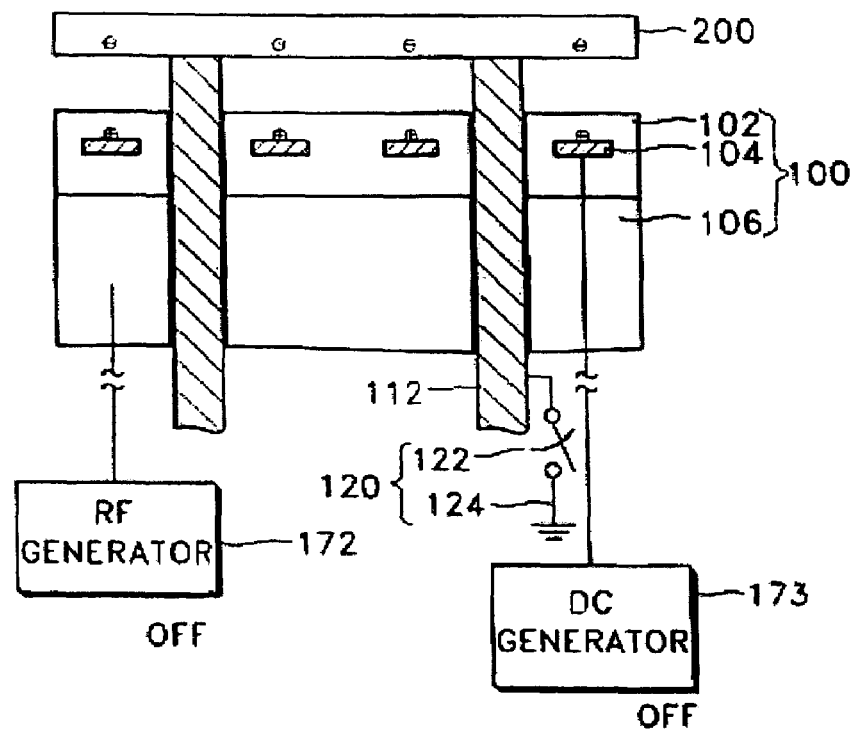

FIG. 3C illustrates a sectional view of a step of placing the lift pins 112 in contact with the wafer 200. Even though the power supply to the lower electrode 106 and the electrostatic electrodes 104 of the electrostatic chuck 100 is turned off and plasma formation in the chamber 152 (of FIG. 2) stops, electric charges remain on the wafer 200 and the upper portions of the electrostatic chuck 100, as shown in FIG. 3C. In order to remove the negative charges remaining on the wafer 200, the lift pins 112 are placed in light contact with the rear side of the wafer 200 when the device for connecting the interconnections 122, for example an on-off switch, of the grounding means 120 connected to a part of the lifting means 110 (of FIG. 2) is opened. When the lift pins 112 are in contact with the rear side of the wafer when the lifting means 110 (of FIG. 2) is grounded, sparks occur due to the potential difference between the wafer 200 and the lift pins 112, thereby damaging the wafer 200. Thus, the lift pins 112 are placed in light contact with the wafer while the lifting means 110 (of FIG. 2) is not grounded.

Figure 3D:
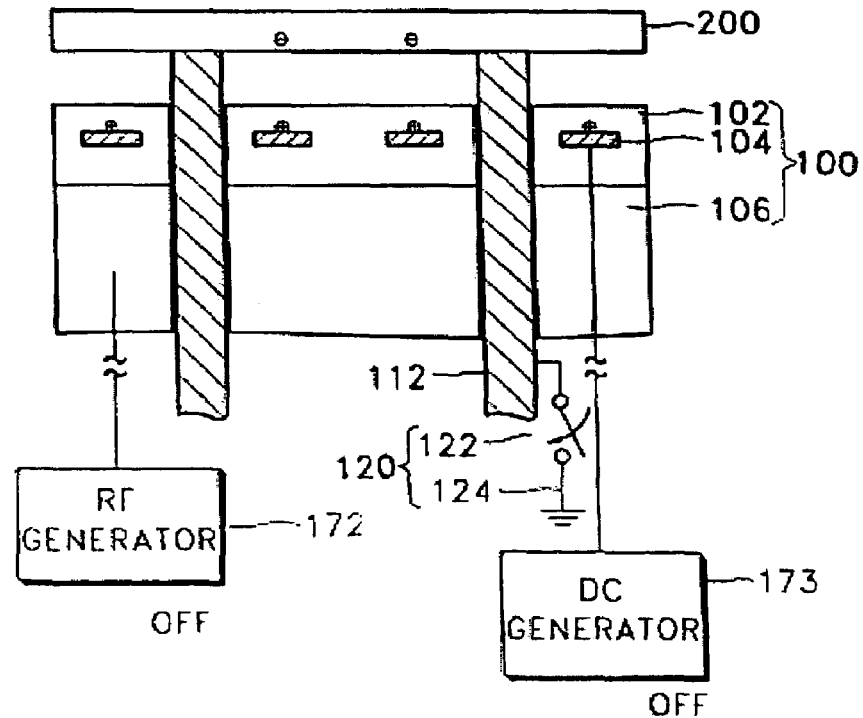

FIG. 3D illustrates a sectional view of a step of grounding the wafer 200 by turning on the device for connecting the interconnections 122 of the grounding means 120 (of FIG. 2) in order to discharge negative charges remaining on the wafer 200. Referring to FIG. 3D, the device for connecting the interconnections 122 of the grounding means 120 connected to part of the lifting means 110 (of FIG. 2) is turned on after the lift pins 112 make contact with the wafer 200. Once the device for connecting the interconnections 122 is turned on, negative charges remaining on the wafer 200 move to ground. However, some negative charges remain on the wafer 200, and cause trouble. Thus, it is necessary to neutralize the electric charges remaining on the wafer 200.

Figure 3E:
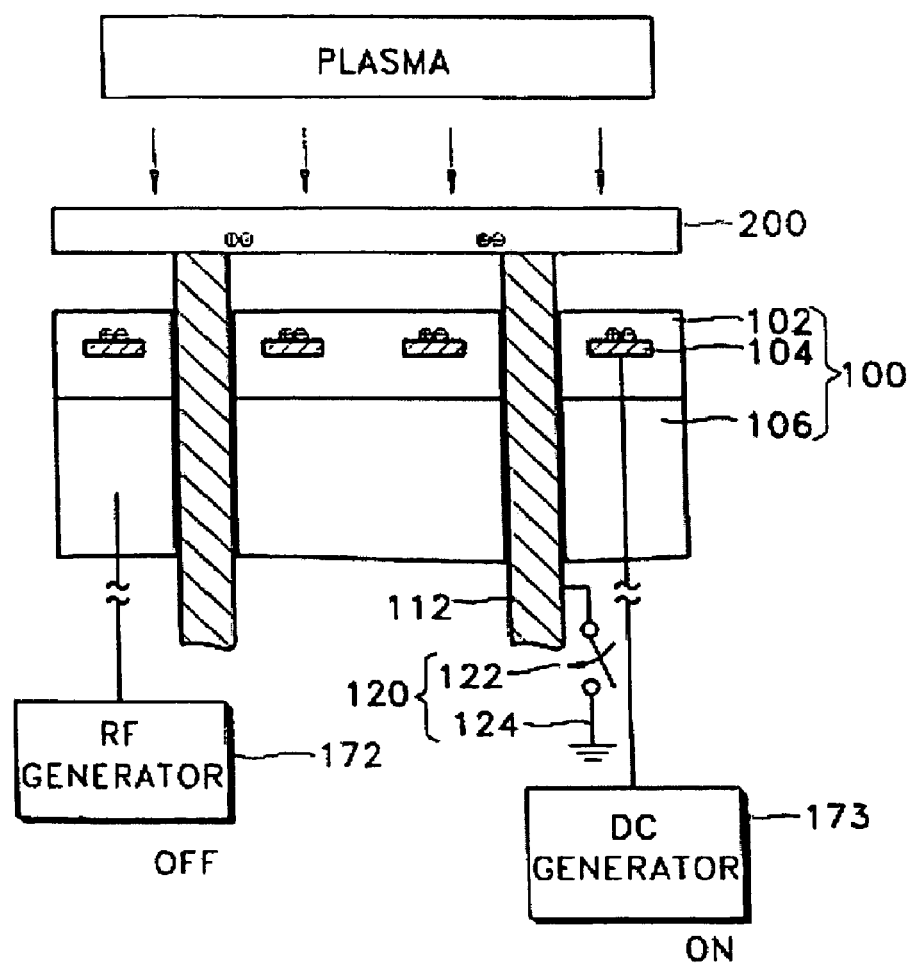

FIG. 3E illustrates a sectional view of a step of neutralizing the wafer 200 and the electrostatic chuck 100. Referring to FIG. 3E, the DC generator 173 neutralizes the upper surface of the electrostatic chuck 100 by supplying power and negative charges to the electrostatic electrodes 104 to neutralize the positive charges on the electrostatic electrodes 104. Also, plasma is generated by applying a small voltage on the upper electrode 150 (of FIG. 2) that does not damage the wafer 200, but neutralizes the negative charge remaining on the wafer 200. The amount of plasma formed is so small that it is negligible compared to the plasma formed during processing of the wafer 200. Thus, the electric charges remaining on the upper portions of the wafer 200 and the electrostatic chuck 100 are completely neutralized. Subsequently, the wafer 200 is dechucked using the lifting means 110 (of FIG. 2).

Table 1 illustrates successful dechucking of wafer (i.e., without defects) in a sample experiment conducted according to a preferred embodiment of the present invention.

TABLE 1

|  | Method for dechucking wafer according to the present invention | | Method for dechucking wafer according to the prior art | |
| --- | --- | --- | --- | --- |
|  | SAC structure | Blanket structure | SAC structure | Blanket structure |
| Number of wafers (nondefective wafers/ total wafers) | 11/11 | 21/21 | 0/8 | 0/27 |

With reference to the sample experiment, the case where an etching process is performed on a $Si_3N_4$ wafer will be described. Using the method for dechucking a wafer according to the present invention resulted in no defective wafers in eleven samples, but using the method for dechucking a wafer according to the prior art resulted in eight defective wafers in eight samples. As shown in Table 1, the method of an embodiment of the present invention allows a wafer to be dechucked without any damage to the wafer, whether used for a blanket structure or a SAC structure.

Because the lifting means is in contact with the wafer and the wafer is grounded in the present invention as described above, sparks between the wafer and the lifting means may be prevented. Also, because plasma is supplied to the wafer and the DC voltage is applied to the electrostatic chuck after the wafer is grounded, sticking between the wafer and the electrostatic chuck may be overcome, and dechucking may thereby easily be performed.

While this invention has been particularly shown and described with references to preferred embodiments thereof, and although specific terms are employed, they are used and are to be interpreted in a generic and descriptive sense only and not for the purpose of limitation. Accordingly, it will be understood by those of ordinary skill in the art that various changes in form and details may be made without departing from the spirit and scope of the invention as set forth in the following claims.

What is claimed is:

1. A method for dechucking a wafer comprising:
   (a) processing a wafer formed on an electrostatic chuck of an enclosed chamber using plasma, wherein plasma used in the chamber is generated on an upper electrode;
   (b) stopping plasma formation and turning off the voltage supplied to an electrostatic electrode and a lower electrode of the electrostatic chuck;
   (c) contacting a lifting means with a rear side of the wafer;
   (d) grounding the wafer;
   (e) neutralizing the electrostatic chuck by supplying power to the electrostatic electrode and neutralizing the wafer by supplying plasma to the wafer; and
   (f) dechucking the wafer by raising the lifting means.

2. A method for dechucking a wafer as claimed in claim 1, wherein the process defined in (a) is an etching process.

3. A method for dechucking a wafer as claimed in claim 1, wherein in (d), a device for connecting the interconnections of a grounding means connected to the lifting means is turned on.

* * * * *